United States Patent [19]

Kinzer

[11] Patent Number: 5,595,918
[45] Date of Patent: Jan. 21, 1997

[54] PROCESS FOR MANUFACTURE OF P CHANNEL MOS-GATED DEVICE

[75] Inventor: Daniel M. Kinzer, El Segundo, Calif.

[73] Assignee: International Rectifier Corporation, El Segundo, Calif.

[21] Appl. No.: 409,181

[22] Filed: Mar. 23, 1995

[51] Int. Cl.⁶ .................................................. H01L 21/265
[52] U.S. Cl. ................................ 437/29; 437/41; 437/979
[58] Field of Search ......................... 437/40 DM, 41 DM, 437/29, 70, 924, 984, 979; 257/327, 328, 335, 336, 337, 338, 339, 340, 341, 342, 343, 329; 148/DIG. 102, DIG. 116

[56] References Cited

U.S. PATENT DOCUMENTS

| | | | |
|---|---|---|---|
| 4,753,898 | 6/1988 | Parrillo et al. | 437/34 |
| 4,771,014 | 9/1988 | Liou et al. | 437/34 |
| 4,803,532 | 2/1989 | Mihara | 257/339 |
| 5,119,153 | 6/1992 | Korman et al. | 257/341 |
| 5,130,767 | 7/1992 | Lidow et al. | 257/341 |
| 5,141,883 | 8/1992 | Ferla et al. | 437/29 |
| 5,288,653 | 2/1994 | Enjoh | 437/29 |
| 5,306,654 | 4/1994 | Kometani | 437/41 DM |
| 5,399,892 | 3/1995 | Neilson et al. | 257/328 |

Primary Examiner—Mary Wilczewski
Assistant Examiner—Brian K. Dutton
Attorney, Agent, or Firm—Ostrolenk, Faber, Gerb & Soffen, LLP

[57] ABSTRACT

There is described a process for making a P channel MOS gated device in which N⁻ bases are first formed through a patterned polysilicon gate structure. A central N⁺ contact is then formed in the center of the surface of each N⁻ base in a second non-critical mask step. A thermal oxide is then grown atop the N⁻ and N⁺ surfaces of each base with differential thickness, the N⁺ surface region growing a thicker oxide. A P⁺ source implant is then carried out, penetrating only the thinner oxide over the N⁻ surfaces. Contact openings are then formed in a third mask process and contact metal is deposited in contact with the P⁺ and N⁺ regions. A ring-shaped termination is simultaneously formed, using the same process steps.

14 Claims, 4 Drawing Sheets

PROCESS FOR MANUFACTURE OF P CHANNEL MOS-GATED DEVICE

BACKGROUND OF THE INVENTION

The present invention relates to MOS-gated devices, and more specifically relates to a novel process for the manufacture of P channel MOS-gated devices which has a reduced mask count and a reduced number of critical mask alignment steps.

MOS-gated devices are well known and include such devices as power MOSFETs, IGBTs and MOS-gated thyristors. The manufacturing process for making such devices includes the use of plural masks which are used in photolithography processes to define the patterns of N and P diffusions, polysilicon layers, dielectric layers and contact metals used to form the device. It is very desirable to reduce the number of masks used in the manufacture process and to reduce the number of critical alignments needed between these masks in order to reduce manufacturing costs and possible wafer defects due to the increased handling of wafers and the use of a larger number of mask steps.

SUMMARY OF THE INVENTION

In accordance with the present invention, a novel process is provided in which the active area and termination area of a MOS-gated device is formed, using only four mask steps and with two critical alignments between masks.

Thus, assuming the use of an active area containing a plurality of polygonal cells, as shown in U.S. Pat. No. 5,008,725 (any active area topology including interdigitation and the like, can be employed with this invention), the first mask layer is used to form a polysilicon gate pattern for the active area, and a polysilicon termination pattern consisting of a plurality of spaced rings surrounding the active area. A plurality of N type base regions are then diffused through the windows defined by the polysilicon gate pattern. At the same time, a plurality of spaced $N^-$ type terminal ring-shaped diffusions can be formed, surrounding the active area as described in co-pending application Ser. No. 08/299,533, filed Sep. 1, 1994 (IR-1113). These diffusions will define series connected N channel MOSFETs for the termination.

In the second mask step, an $N^+$ contact region is defined and formed in the center of the $N^-$ base region. At the same time, $N^+$ regions may be formed in the center of the $N^-$ terminal diffusions. An oxide is then grown over the surface of the device, with the oxide over the central $N^+$ base region growing faster and becoming thicker there the oxide over the surrounding $N^-$ surface. A $P^+$ annular source is then implanted through the thinner oxide surrounding the thick oxide above the $N^+$ contact region. The $P^+$ implant is at an energy which is too low to penetrate the thick oxide above the $N^+$ contact region or the surrounding polysilicon for each cell. Thus, both the $N^-$ contact region and $P^+$ source region are formed, and are inherently self-aligned, in a single mask step.

In the third mask step, which is a contact mask, a mask which defines an opening aligned with an annular portion of the $P^+$ source is critically aligned to the second mask to permit the etching of all oxide covering a central area of the $P^+$ source and the central $N^+$ contact diffusion. Contact metal, for example, aluminum then covers the upper surface of the device and, at each cell, contacts both the exposed $P^+$ source and its internal $N^+$ base contact. At the same time, small contact openings can be defined to permit connection of each $N^-$ terminal ring to the polysilicon ring which overlaps the next $N^-$ region.

A fourth mask step is then carried out to pattern the metal in the usual manner and also to pattern small metal contacts which connect the terminal N MOS rings in series by connecting an inner $N^-$ ring to the next outermost polysilicon ring.

Other features and advantages of the present invention will become apparent from the following description of the invention which refers to the accompanying drawings.

BRIEF DESCRIPTION OF THE DRAWING(S)

DETAILED DESCRIPTION OF THE INVENTION

Figure 1:
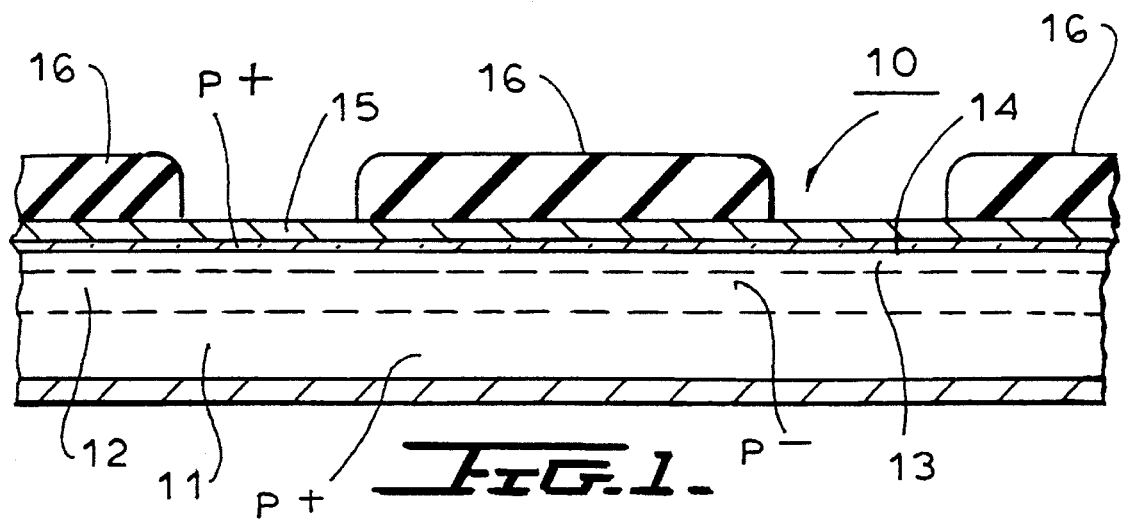
FIG. 1 shows a cross-section of a portion of a starting wafer after the first mask step.

FIG. 1 shows a small portion of a wafer 10 of silicon having a $P^+$ body 11 and an epitaxially deposited $P^-$ region 12. All junctions are to be formed in the epitaxial region 12.

A blanket $P^+$ implant 13 may be applied to the top of region 12 to ultimately form an increased concentration in the common conduction region later formed between spaced bases, thus reducing any N-FET pinch in that region as disclosed in U.S. Pat. Nos. 4,376,286 and 4,680,853. Thereafter, a gate oxide 14 and polysilicon layer 15 are grown atop the upper surface of wafer 10. A photoresist 16 is then deposited atop polysilicon layer 15.

Figure 6A:
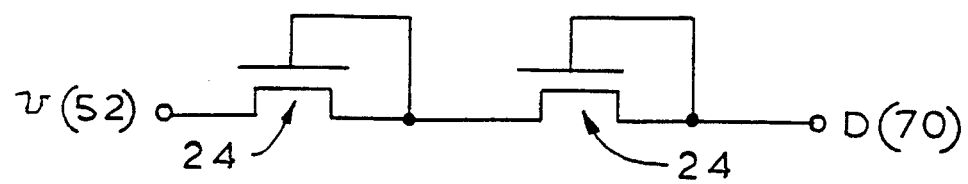
FIG. 6a is a circuit diagram of the N MOS terminal ring shaped diffusions of FIG. 6.
Figure 6:
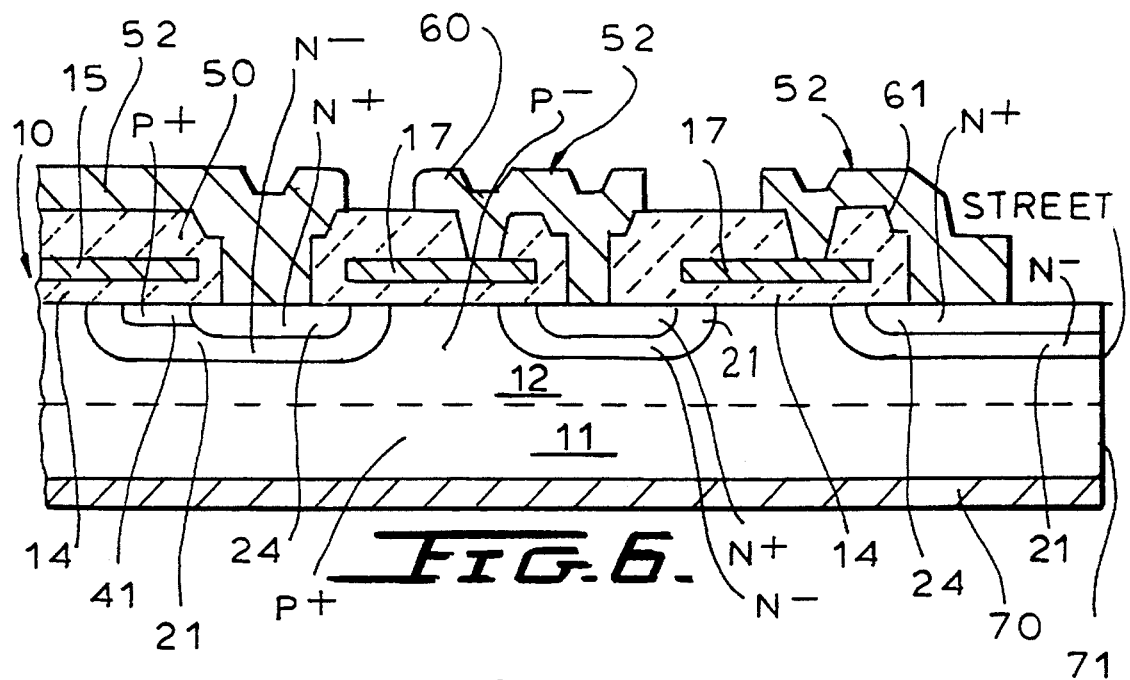
FIG. 6 shows a cross-section at the edge of the wafer of FIG. 5 after the fourth contact mask.

A first mask step is then carried out to define a desired photoresist pattern atop the polysilicon 16 and to define the desired gate pattern for the polysilicon layer 15 in the active area, and the polysilicon rings 17 in the termination structure of FIG. 6. Note that a plurality of identical die are patterned identically in the mask. The wafer section shown in the drawings is a section of one of these die. However, the terms "wafer" and "die" are used interchangeably herein.

Figure 2:
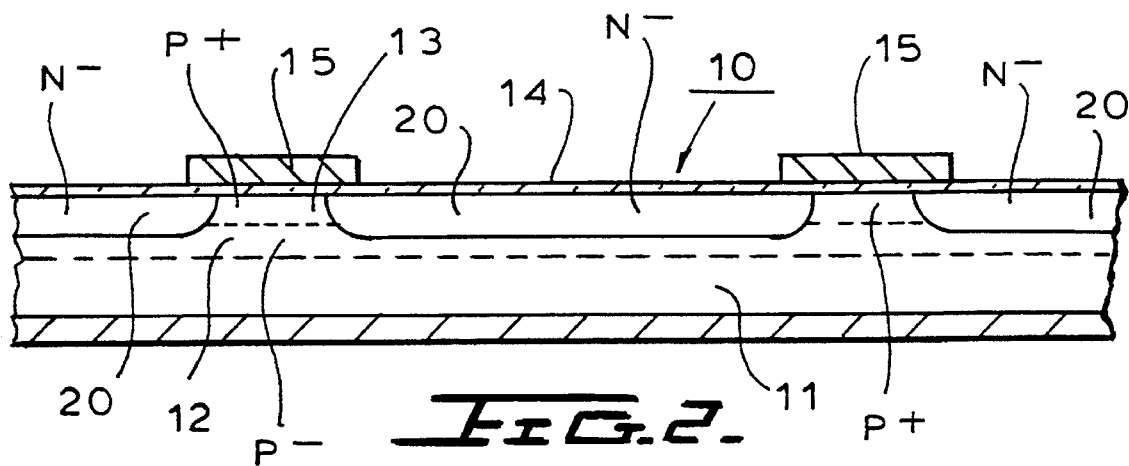
FIG. 2 shows the wafer of FIG. 2 after the patterning of the polysilicon and diffusion of the $N^-$ base.

After the first mask step, the exposed polysilicon layer 15 is etched by a silicon etch down to the oxide layer 14 as shown in FIG. 2. A phosphorus implant (5E13) is then carried out and diffused at about 1175° C. for about 45 minutes to form $N^-$ base diffusions 20, which may have a depth of about 2 micrometers.

These diffusions are of the shape of closed polygons, preferably hexagons, but may have any desired shape or topology. Note that N⁻ rings 21 (FIGS. 6 and 7) are also formed at this step.

Figure 3:
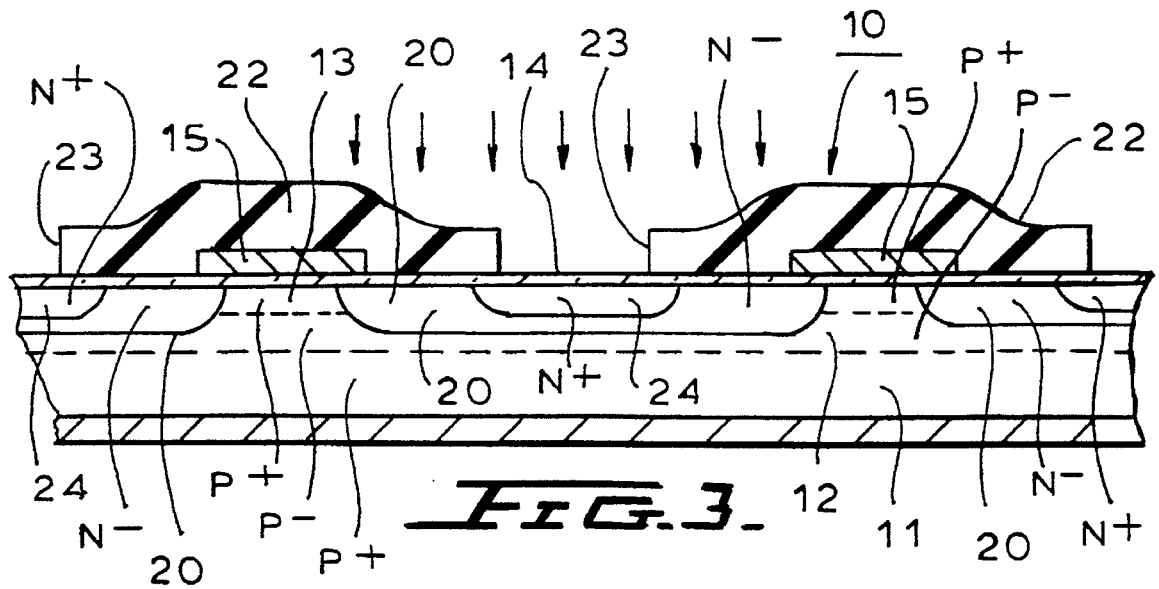
FIG. 3 shows the wafer of FIG. 2 after the formation of the $N^+$ region in the $N^-$ base in a second mask step.

As next shown in FIG. 3, a photoresist layer 22 is formed atop the wafer surface. A second mask is then used to pattern a photoresist so as to open the photoresist at regions 23 located in the centers of N⁻ base regions 20 and in a central annulus of N⁻ rings 21 in FIG. 6. Thereafter, a phosphorus implant of dose 5E15 is implanted into the surfaces exposed by openings 23 in the photoresist to form N⁺ contact region 24 in the center of the N⁻ bases 20 and N⁺ rings 25 in the N⁻ rings 21 of FIG. 6. Alternatively, a thickened oxide can be used as the mask at this step.

In a typical geometry, base 20 has a width of about 8 microns and is spaced about 6 microns from adjacent bases. The central N⁺ contact area has a width of about 3 microns, and a depth of about 0.5 microns.

Figure 4:
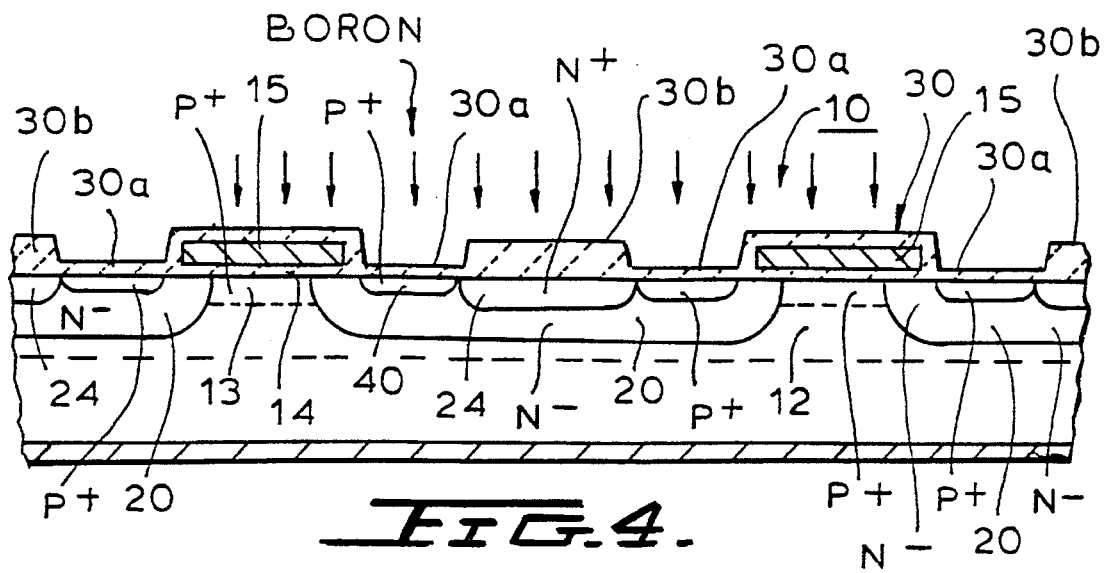
FIG. 4 shows the wafer of FIG. 3 after the differential growth of oxide over the $N^-$ and $N^+$ base surface areas, and after the implant of a $P^+$ source through the thinner oxide over the $N^-$ surface region.

After the formation of central region 24, the photoresist 22 is stripped and a thermal oxide 30 is grown over the surface of the device as shown in FIG. 4. For example, the oxide can be grown in wet steam at about 900° C. for about 30 minutes. The oxide 30 has a differential thickness; the portion 30a in FIG. 4 which grows over the N⁻ silicon surface grows to a thickness of about 800 Angstroms, while the portion 30b which grows over N⁺ regions 24 grows faster and to a thickness of 2500 Angstroms. Consequently, in each cell, a thin annulus 30a of oxide surrounds the thicker central bottom 30b. It is then possible to implant a P⁺ source region through the thinner oxide 30a but not the thicker bottom 30b or the surrounding polysilicon gate 15.

Thus, in the next process step, the surface of the wafer of FIG. 4 is exposed to a boron implant at an energy of 40 kv and dose of 2E15.

This implant penetrates only the thin oxide annuli 30a (and a corresponding thin ring in FIG. 6) to form P⁺ source regions 40 (FIGS. 4 and 5) and the P⁺ terminal source diffused ring 41 in FIG. 6.

Note that this process saves an extra critical mask step and ensures self-alignment between sources 40 and N⁻ bases 20.

Figure 5:
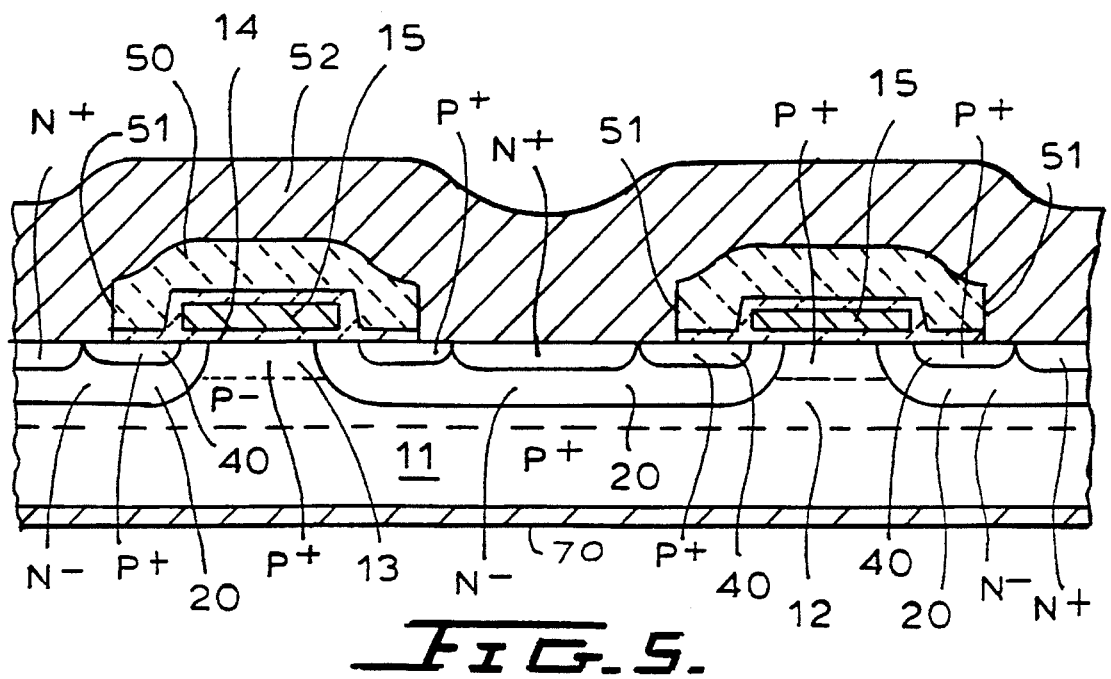
FIG. 5 shows the wafer of FIG. 4 after the third and contact mask step, and after the deposition of contact metal.

Thereafter, a low temperature oxide layer 50 is grown atop the surface of the structure of FIG. 4 and, in a third mask step, which is critically aligned to the second mask of FIG. 3, a central region 51 of each of the N⁻ bases 20 is exposed for metallizing, as shown in FIG. 5. A metal (aluminum) layer 52 is then deposited and contacts the P⁺ source 40 and N⁺ contact region 24 of each cell. Contact layer 52 is the source contact of a power MOSFET or would be the emitter or cathode electrode of an IGBT or MOS controlled thyristor, respectively.

At the same time the contact metal 52 overlies the terminal structure of FIG. 6 and contacts the silicon surface as shown through openings formed during the contact mask step of FIG. 5.

Thereafter, a fourth but non-critical mask step is carried out to separate the contact metal 52 as necessary and to define the separate contacts 60 and 61 which connect the two outer ring shaped N MOS terminal rings in series as shown in the circuit diagram of FIG. 6a. Note that any number of rings can be used for the termination, depending on the voltage being terminated.

A back contact 70, which is a drain contact, is applied to the bottom surface of wafer 10. Contact 70 is connected to the top edge of wafer (or chip or die) 10 over the street or edge 71 of the chip in FIG. 6.

Figure 8:
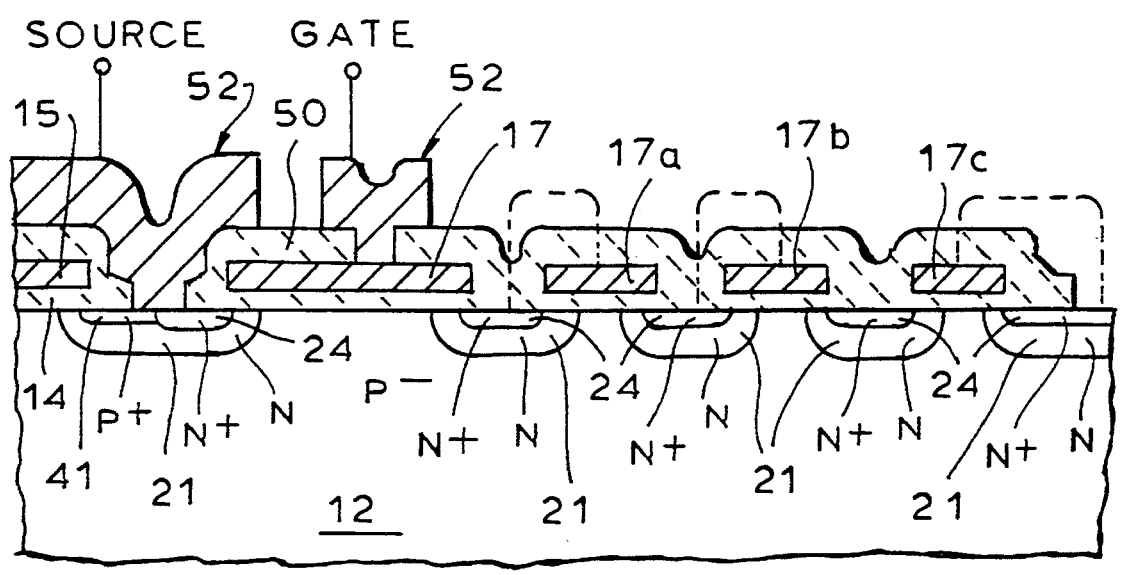
FIG. 8 shows a cross-section at the edge of the wafer of FIG. 5 with an alternate termination to that of FIG. 6.

FIG. 8 shows an alternate termination to that of FIG. 6. In FIG. 8, components identical to those of FIG. 6 have the same identifying numerals. The termination of FIG. 8 is similar to that shown in U.S. Pat. No. 5,474,946, but the conductivity types are reversed.

Figure 7:
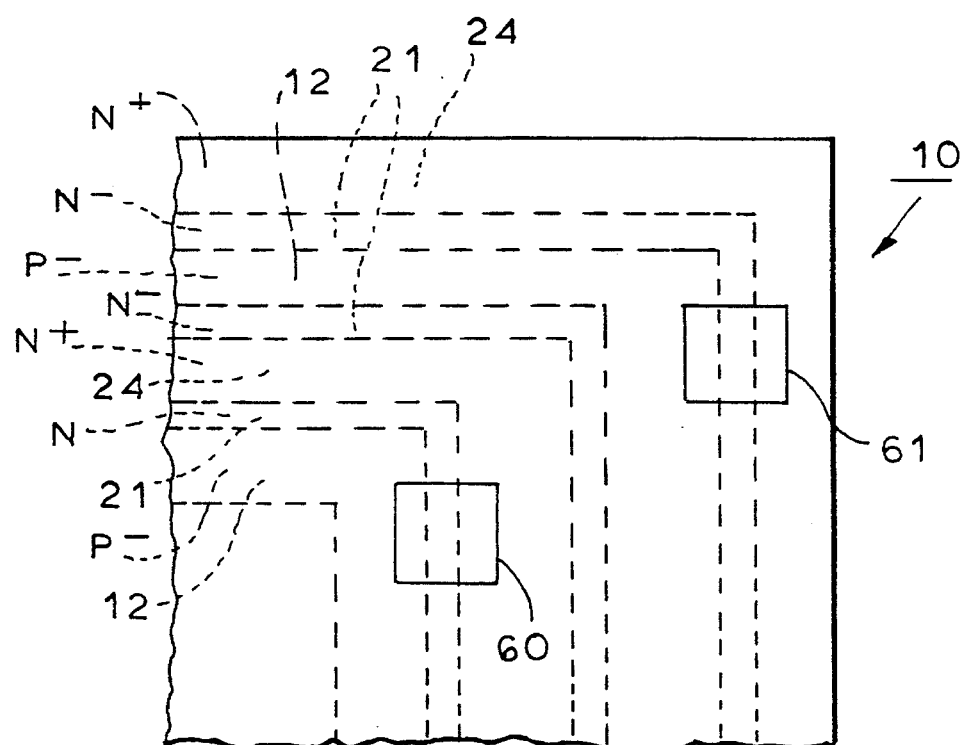
FIG. 7 shows a top view of FIG. 6 to illustrate the placement of the contacts which connect the N MOS rings in series.

Referring to FIG. 8, a plurality of spaced N type rings 21 are formed during the base cell formation 20 and N⁺ rings 24 are formed in the process step forming cellular region 24. A plurality of polysilicon rings, 17a, 17b and 17c are also formed during the mask step which defines the polysilicon pattern in FIGS. 1 and 2. Each N⁺ region 24 is then connected by small contacts, as shown in FIG. 7, to the next outward rings 17a and 17b. The last ring 17c is connected to the end ring 24.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A process for forming a P channel MOS-gated device comprising the steps of: forming a gate dielectric layer atop a P-type silicon wafer; forming a polysilicon layer atop said gate dielectric layer; patterning and etching away respective regions of said polysilicon layer in a first masking step to form a gate electrode layer; introducing N-type dopants into said silicon wafer using said gate electrode layer as a mask to form N⁻ bases which underlie edges of said etched polysilicon layer into said silicon wafer through said respective regions etched away from said polysilicon layer; forming respective N⁺ regions centrally within the surface of each of said N⁻ bases; growing, in the same growth step, an oxide on said gate electrode layer, said N⁻ bases and said N⁺ regions that has a first portion located atop said N⁺ regions and has a second portion located atop said N⁻ bases that is thinner than said first portion; and implanting P-type carriers at an energy at which said P-type carriers penetrate through said second portion of said oxide but do not penetrate through said first portion of said oxide to form a respective self-aligned P⁺ source region in each of said N⁻ bases.

2. The process of claim 1 which further includes the steps of etching said oxide to completely remove said first portion and to partially remove said second portion to leave a remaining portion of said oxide on said gate electrode and on a portion of said P⁺ source region and thereby exposing a remaining portion of said P⁺ source regions and said N⁺ regions to metallization, and depositing a metal layer atop said silicon wafer which contacts said exposed portion of said P⁺ source regions and said N⁺ regions of each of said N⁻ bases.

3. The process of claim 1 wherein said gate dielectric layer is silicon dioxide.

4. The process of claim 1 wherein said step of patterning and etching away respective regions of said polysilicon layer forms a plurality of symmetrically spaced polygonal-shaped openings in said polysilicon layer, thereby defining a plurality of symmetrically disposed, spaced polygonal N⁻ regions in the surface of said wafer when said N⁻ bases are diffused into said wafer.

5. The process of claim 1 wherein a P⁺ diffusion is formed beneath said gate dielectric layer and wherein said P⁺ source region is disposed in a space located between at least two of said N⁻ bases.

6. The process of claim 1 wherein a plurality of spaced N⁻ rings are diffused into a terminal area on said wafer during the step of diffusing said N-type dopants to form N⁻ bases, and wherein spaced polysilicon rings which extend across the spaces between said spaced N⁻ rings are formed during the step of etching away respective regions of said polysilicon layer; each of said polysilicon rings being connected to the next outermost N⁻ ring.

7. The process of claim 3 which further includes the steps of etching said oxide to completely remove said first portion and to partially remove said second portion to leave a remaining portion of said oxide on said gate electrode and on a portion of said P+ source region and thereby exposing a remaining portion of said P⁺ source regions and said N⁺ regions to metallization, and depositing a metal layer atop said silicon wafer which contacts said exposed portion of said P⁺ source regions and said N⁺ regions of each of said N⁻ bases.

8. The process of claim 3 wherein said step of patterning and etching away respective regions of said polysilicon layer forms a plurality of symmetrically spaced polygonal-shaped openings in said polysilicon layer, thereby defining a plurality of symmetrically disposed, spaced polygonal N⁻ regions in the surface of said wafer when said N⁻ bases are diffused into said wafer.

9. The process of claim 3 wherein a P⁺ diffusion is formed beneath said gate dielectric layer and wherein said P⁺ source region is disposed in a space located between at least two of said N⁻ bases.

10. The process of claim 3 wherein a plurality of spaced N⁻ rings are diffused into a terminal area on said wafer during the step of diffusing said N-type dopants to form N⁻ bases, and wherein spaced polysilicon rings which extend across the spaces between said spaced N⁻ rings are formed during the step of etching away respective regions of said polysilicon layer; each of said polysilicon rings being connected to the next outermost N⁻ ring.

11. The process of claim 5 wherein said step of patterning and etching away respective regions of said polysilicon layer forms a plurality of symmetrically spaced polygonal-shaped openings in said polysilicon layer, thereby defining a plurality of symmetrically disposed, spaced polygonal N⁻ regions in the surface of said wafer when said N⁻ bases are diffused into said wafer.

12. A process for forming a semiconductor device with self-aligned N⁺ and P⁺ surface regions; said process comprising the steps of forming an N⁻ diffusion in the surface of a semiconductor wafer; forming an N⁺ region within said N⁻ diffusion; concurrently growing a thermal oxide atop both said N⁺ region and said N⁻ diffusion, whereby a first portion of said thermal oxide that is located atop said N⁺ region grows to a greater thickness than a second portion of said thermal oxide that is located atop said N⁻ diffusion; and implanting a P-type impurity at an energy sufficient to penetrate only the second portion of said thermal oxide that is atop said N⁻ diffusion to form a P⁺ region that is adjacent to said N⁺ region.

13. The process of claim 12 which further includes the step of providing a polysilicon gate structure on said surface of said semiconductor wafer; said polysilicon gate structure having a border; said N⁻ diffusion diffusing into said wafer and laterally beneath said border of said polysilicon gate structure; said energy of said P type impurity being insufficient to penetrate said polysilicon gate structure.

14. The process of claim 13 wherein said border of said polysilicon gate structure has a closed polygonal topology.

* * * * *